United States Patent [19]

Clearwaters-Dreager et al.

[11] Patent Number: 5,371,326

[45] Date of Patent: Dec. 6, 1994

[54] NON-TOXIC FABRIC CONDUCTORS AND METHOD FOR MAKING SAME

[76] Inventors: Cindy Clearwaters-Dreager; Thomas N. Dreager, both of 41 Church St., P.O. Box 327, Versailles, Conn. 06383

[21] Appl. No.: 114,611

[22] Filed: Aug. 31, 1993

[51] Int. Cl.$^5$ .............................................. H01B 5/16
[52] U.S. Cl. ............................ 174/128.1; 174/126.2; 174/257; 428/244; 428/281
[58] Field of Search ............... 174/128.1, 126.1, 126.2, 174/256, 257; 428/281, 283, 295, 240, 244

[56] References Cited

U.S. PATENT DOCUMENTS

| | | | |
|---|---|---|---|
| 3,132,065 | 5/1964 | Barsy et al. | 428/281 |
| 3,340,606 | 9/1967 | Anderson et al. | 29/849 |
| 3,516,899 | 6/1970 | Saunders | 428/198 |
| 3,699,011 | 10/1972 | Nishimura | 204/15 |
| 3,714,709 | 2/1973 | Liederbach | 29/626 |
| 4,303,733 | 12/1981 | Buille et al. | 428/367 |
| 4,412,272 | 10/1983 | Wedertz | 361/383 |
| 4,548,862 | 10/1985 | Hartman | 428/323 |
| 4,565,727 | 1/1986 | Giglia et al. | 428/172 |
| 4,623,951 | 11/1986 | DuPont et al. | 361/218 |
| 4,677,019 | 6/1987 | von Blucher | 428/244 |
| 4,742,431 | 5/1988 | Igarashi | 361/398 |
| 4,814,945 | 3/1989 | Leibowitz | 361/414 |
| 4,834,805 | 1/1987 | Orban | 174/128 R |
| 4,895,620 | 1/1990 | Ko et al. | 162/138 |
| 4,898,766 | 2/1990 | Tamamura et al. | 428/195 |
| 4,937,133 | 6/1990 | Watanabe et al. | 428/209 |
| 5,047,895 | 9/1991 | Sasaki | 361/398 |
| 5,057,969 | 10/1991 | Ameen et al. | 361/386 |
| 5,098,771 | 3/1992 | Friend | 428/209 |
| 5,234,627 | 8/1993 | Damschroder | 252/502 |
| 5,291,653 | 3/1994 | Ichikawa | 29/846 |

*Primary Examiner*—Morris H. Nimmo
*Attorney, Agent, or Firm*—Kenyon & Kenyon

[57] ABSTRACT

An electrical conductor and method of making same is disclosed whereby the conductor is particularly suited for use in soft children's toys because it is washable, non-toxic, safe, durable and crumple-resistant. The conductor is comprised of a nonwoven material which has been impregnated with conductive ink to form electric circuits within the fiber of the material. The circuits conduct currents sufficient to drive a plurality of detachable integrated circuits which are actuated by the pressing of pressure-sensitive switches which touch two conductive fabric traces to complete a circuit. Additionally, the conductors may be designed to have different resistances and combined within a circuit to form electric components capable of controlling and directing the flow of current.

7 Claims, 9 Drawing Sheets

NON-TOXIC FABRIC CONDUCTORS AND METHOD FOR MAKING SAME

BACKGROUND OF THE INVENTION

1. Field of the Invention

This invention relates to electrical conductors, and more particularly, to washable, painted-on electrical conductors and a method for making such conductors with varying resistances.

2. Description of the Related Art

Fabric-enclosed toys for young children are popular and well-known. Such toys may contain layers of fabric, foam rubber, or the like, to make the toys soft and flexible. In addition, with the advent of low-cost electronic circuitry, it has become popular to place such circuitry in toys to make them responsive to the child in various ways. Sound synthesis circuitry, for example, has been used in many toys to make sounds when a switch is activated.

The electronic circuitry used in many such toys includes a discrete switch connected to an electronic circuit board by wires. In some instances, switches made out of plastic sheeting with a hard backing have been used. While these switches can be advantageous in many plastic toys, they are less advantageous when used in a soft toy such as a stuffed animal because the switch often creates hard lumps that detract from the toy's soft ambience. Instead, it is desirable to employ an electronic switch that accents the humanistic aesthetics so essential to a successful soft toy.

Because soft toys inevitably become soiled, it is advantageous for these toys to be fully washable. Soft toys containing electronic switches have, in the past, only been surface washable. Even after removing batteries and electronics from traditional soft toys, washing would permanently damage the remaining unremovable switches and wiring.

Historically, electronic toys have had a high return-for-repair rate. This problem often occurs because of wiring that has become inflexible. Stress points often occur near solder points. In a soft toy, it may take only a few bends before the wire breaks. Thus, there is a need for a wiring system that is inherently flexible and does not require soldering. Such wiring should also be easy to connect with electronic assemblies and inexpensive to manufacture. The wiring should be non-toxic, and should be safe for use in toys for small children such that it avoids the possibility of strangulation. In addition, the wiring should provide low resistance, even after being washed several times.

Additionally, in all electrical circuits it is advantageous to employ conductors of varying resistance in order to direct and control current flow within the circuit. Historically, electronic toys have had to incorporate hard electrical components (such as resistors) within the electric circuits to accomplish this function, thus reducing the toy's humanistic appeal and its ability to be washed. As it is possible for a child to swallow a small part upon its accidental separation from the toy, such components also present safety risks. If such components are used in electronic toys, they should be washable, soft, non-toxic and safer as should be the electric wiring.

SUMMARY OF THE INVENTION

In accordance with the present invention, a low-resistance electrical conductor is provided, comprising a non-woven fabric, preferably with natural fiber content, coated with a conductive paint or spray coating comprising an aqueous dispersion of conductive carbon black in a latex binder. The conductive paint or spray is provided in sufficient quantity to soak into the fabric and is cured at no more than approximately 170° C. and preferably no more than about 150° C. for about 0.5 to 2 hours. Conductors of varying resistances may be produced by employing different formulations of the conductive paint or spray for different conductive strips within the circuit and also by varying the lengths and widths of the strip. The resulting conductors of different resistances may be combined in circuit paths as electrical components to direct and control current flow within the circuit.

It is accordingly an object of this invention to provide non-toxic and safe electrical wiring and electrical components suitable for use in fabric-enclosed toys for young children.

It is also an object of this invention to provide a method for making such wiring and components.

It is an additional object of this invention to provide electrical wiring and electrical components suitable for switches that preserve the soft ambience and humanistic aesthetics of soft toys.

It is a further object of this invention to provide durable, flexible electrical wiring and electrical components.

It is another object of the invention to provide electrical wiring and electrical components that can be fully washed along with the soft toy in which it is used, and yet maintain low resistances even after several washings.

It is a further object of this invention to provide electrical wiring and electrical components that will retain their conductivity even after being crumpled.

And it is a further object of the invention to provide electrical wiring and electrical components that are both inexpensive to produce and easy to manufacture with toy assemblies.

These and other further objects of the invention will become clear in the detailed description that follows.

DESCRIPTION OF THE PREFERRED EMBODIMENTS

The electrical wiring and components of this invention are made by applying paint to a fabric and curing the paint. A non-toxic conductive paint is used, comprising an aqueous dispersion of conductive carbon black with a latex binder. A suitable conductive paint is available from Wescorp Static Control Products, 144-T S. Whisman Road, Mountain View, Calif. 94041, and bears the designation W-0735 Condu-Cote Coating. This paint is of a type originally intended for such uses as microwave antenna test chambers, where it is used to dissipate electromagnetic energy striking the walls of the chamber. This paint is non-toxic and suitably conductive for use with the electronic circuitry and low voltages found in children's battery-powered toys. Any other conductive paints, sprays, jellies, pastes or lotions suitable for application to fabric and containing carbon in the one to ten percent loading range in a water-based latex with any number of organic, ionic or non-ionic surfactants but without volatile organics may be used, and references herein to "conductive paint" shall be intended to incorporate these terms as well. The absence of volatile organics ensures that the conductive paint will be non-toxic. Varying the carbon loading in the conductive paint varies the resistance of the wiring and components produced from that formulation; that is, increasing the carbon loading increases conductivity and decreases resistivity. Conversely, decreasing the carbon loading decreases conductivity and increases resistivity. Varying the lengths and widths of the strips varies their effective resistance as well; that is, painting shorter and wider conductive strips increases conductivity and decreases resistivity. Conversely, painting longer and more narrow conductive strips decreases conductivity and increases resistivity.

The conductive paint or spray is applied to a fabric, preferably a non-woven fabric, and more preferably, a non-woven fabric with natural fiber content. The paint should be applied in a quantity sufficient to soak into the fibers of the fabric. If it is hand painted using a brush, the paint should be generously applied directly onto the fabric. If the paint is air brushed, the paint must be applied in sufficient quantity to soak into the fabric and not just cover the top surface. Commercial textile printing can also be used as long as enough paint is used to soak into the fabric and not just lay on the top surface. The paint is then cured at a temperature of no more than approximately 150° C. for between about 0.5 to 2.0 hours. The resulting conductors are especially suitable for low voltage circuitry, e.g., approximately 4.5 volts. However, the exact voltage used in the low-voltage circuitry is not believed to be critical.

It is contemplated that the resulting conductors best be used in pairs, separated by a soft, resilient material, such as foam rubber, having apertures through which the conductors can make contact when pressure is applied. The two conductors thus act as the two poles of a switch. The conductors can be connected to a circuit board by means of plastic compression spring clips. The conductors on the circuit board may be conventional printed circuit conductors.

A preferred way of making a soft "keypad" is the following:

1. Apply the conductive paint to a nonwoven fabric (layers 7 and 9 in FIG. 2) by hand painting, air brushing, or textile printing. The paint must be applied in sufficient quantity to soak into the fabric and not just cover the surface. For most circuits, application in $\frac{1}{2}$ inch wide strips should provide an adequately low resistance.

2. Cure the painted layers 7 and 9 at 150° C. for between $\frac{1}{2}$ to 2 hours.

3. Print a graphic design on the outside layer(s), as on layer 6. The graphic design indicates the approximate location of the switch. The fabric used for the outside layers should be one that does not allow a build-up of static charge, as it may ruin the semiconductor components of the circuitry. For example, nylon backed with a plastic coating is inferior to cotton broadcloth for the outer layers of fabric because the nylon and plastic tend to collect a static charge.

4. Die cut a layer of foam rubber 8 for use between layers 7 and 9. Foam rubber about $\frac{1}{4}$ inch thick is satisfactory. With this thickness of foam rubber, the holes should be no more than $\frac{1}{2}$ inch wide by $\frac{1}{2}$ inches long with at least $\frac{1}{8}$ inch of foam between the holes. These dimensions are adequate to prevent layers 7 and 9 from contacting one another without pressure being applied.

5. Cut the fabric and foam layers to the pattern shape for each.

Figure 3:
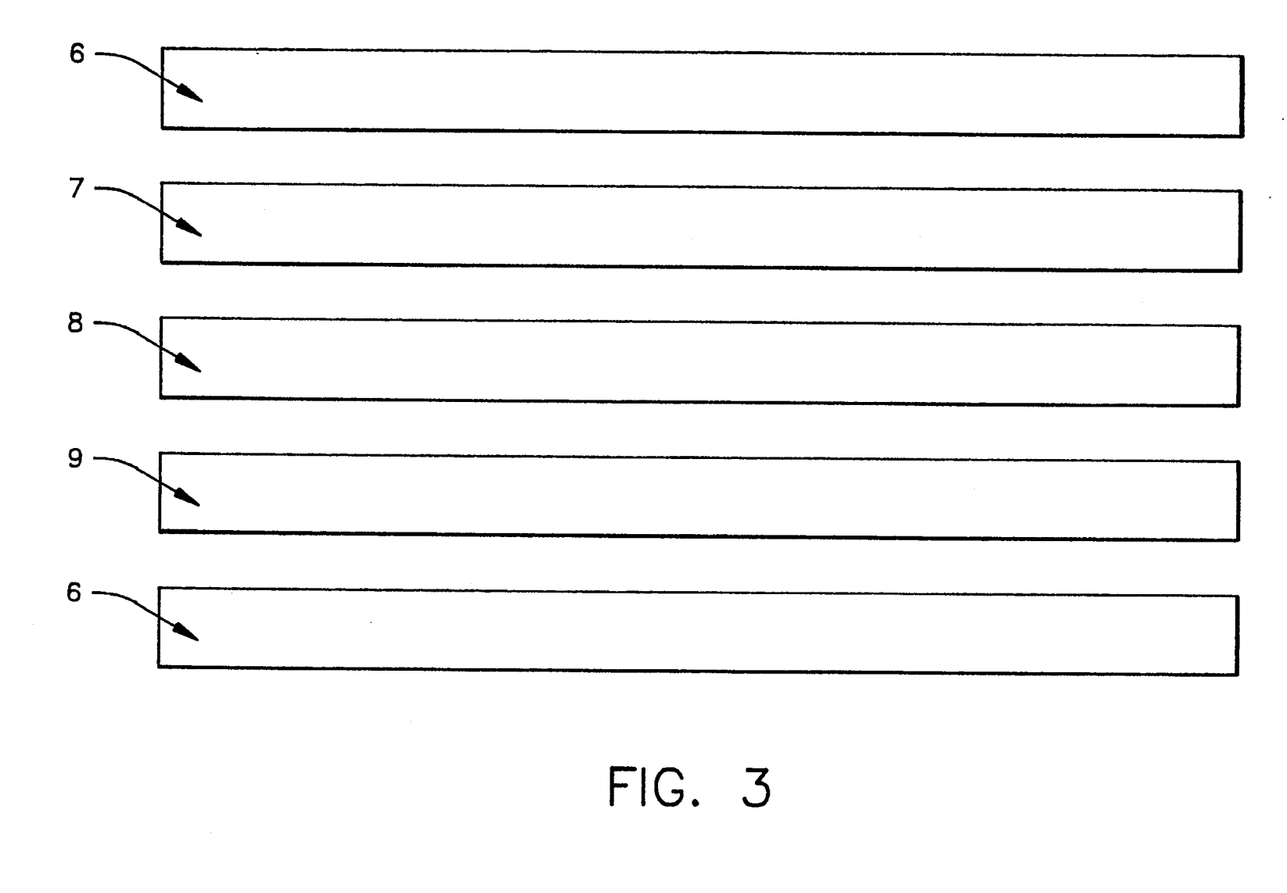
FIG. 3 shows the order in which the various layers of the soft circuit key pad are collated.
Figure 4:
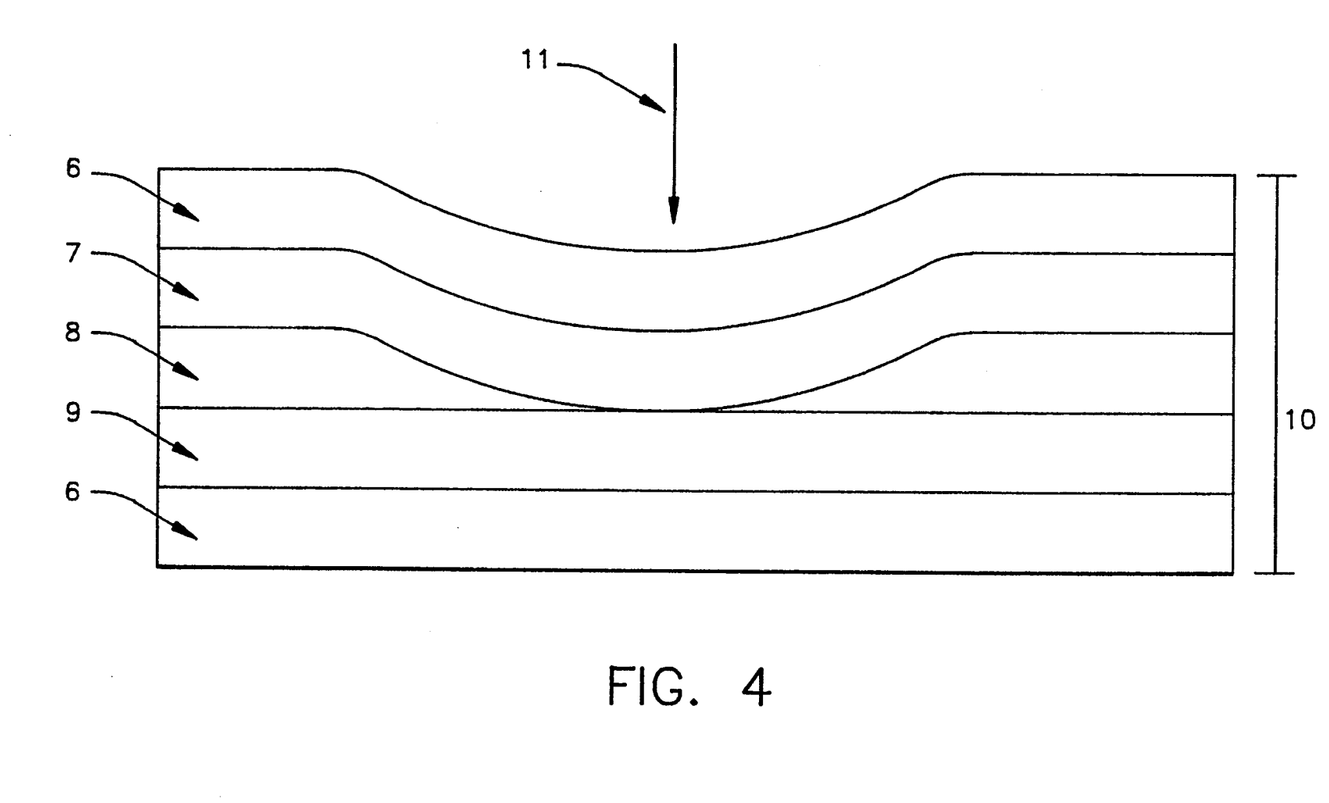
FIG. 4 shows how the various layers of the soft circuit key pad connect to permit the flow of electric current when pressure is applied to one of the exterior layers.
Figure 5:
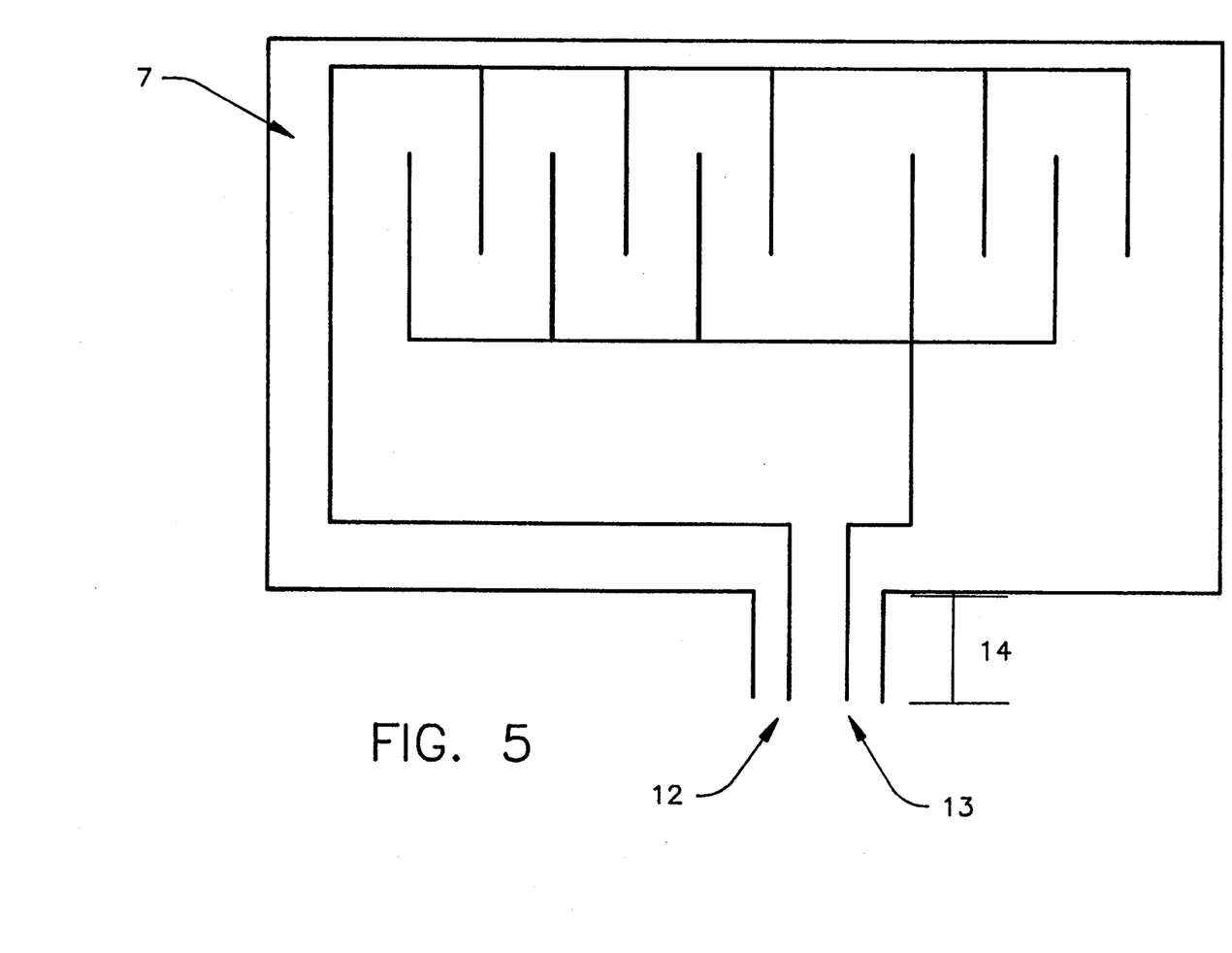
FIG. 5 shows the conductive paint circuit trace of a single-task circuit.
Figure 6:
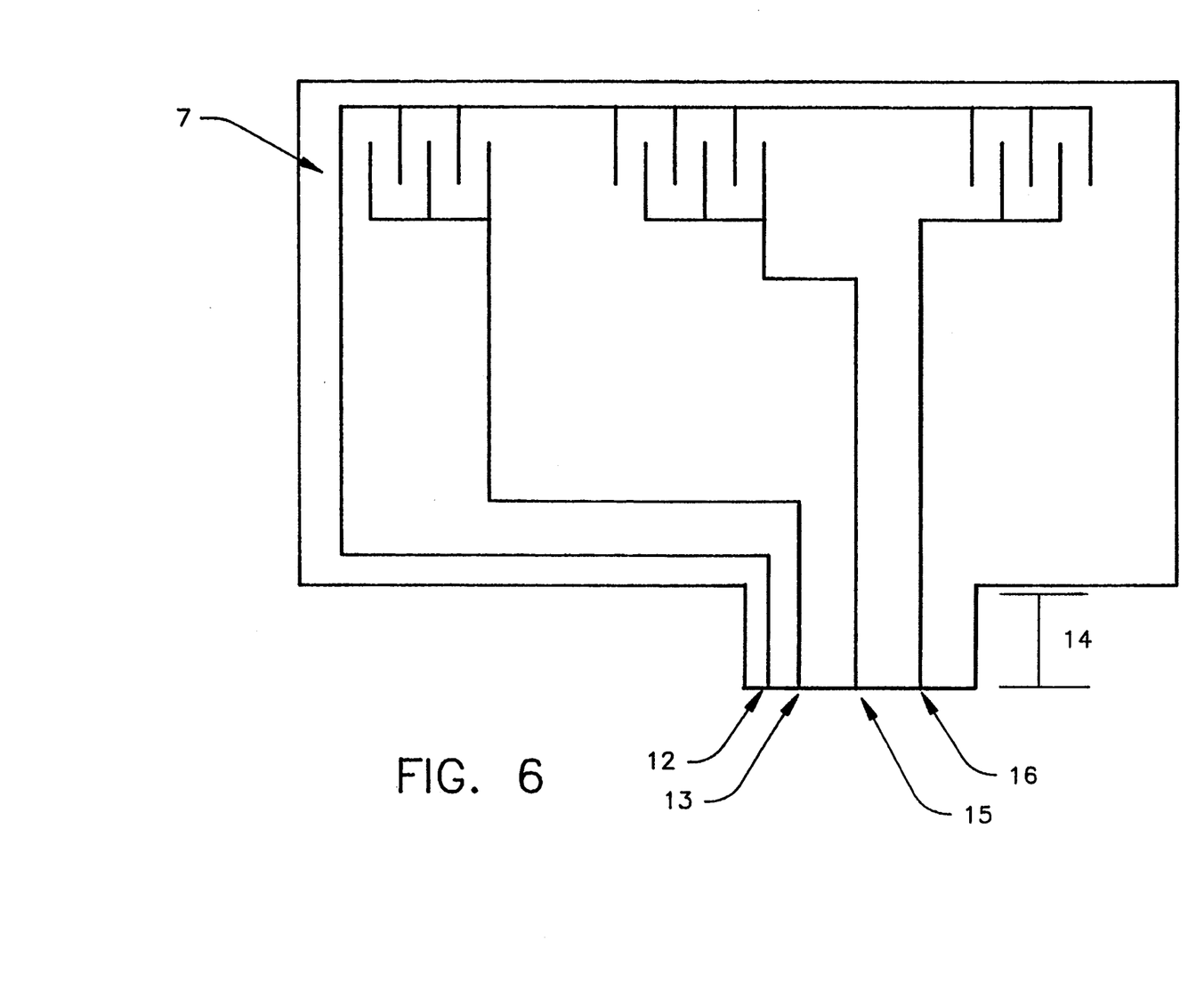
FIG. 6 shows the conductive paint circuit trace of a three-task circuit.

6. Collate the foam and fabric layers as shown in FIG. 3.

Figure 7:
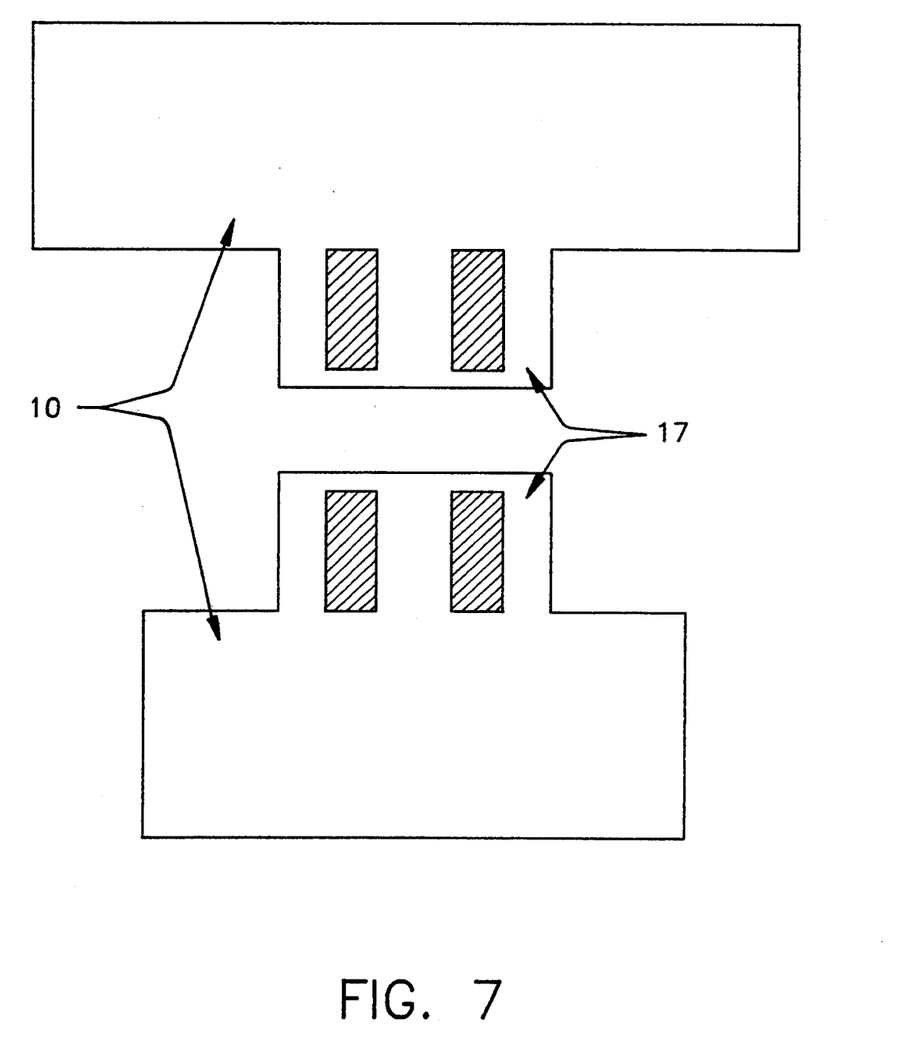
FIG. 7 shows how the soft circuit key pad is connected to other soft circuit key pads via circuit continuation tabs.
Figure 8:
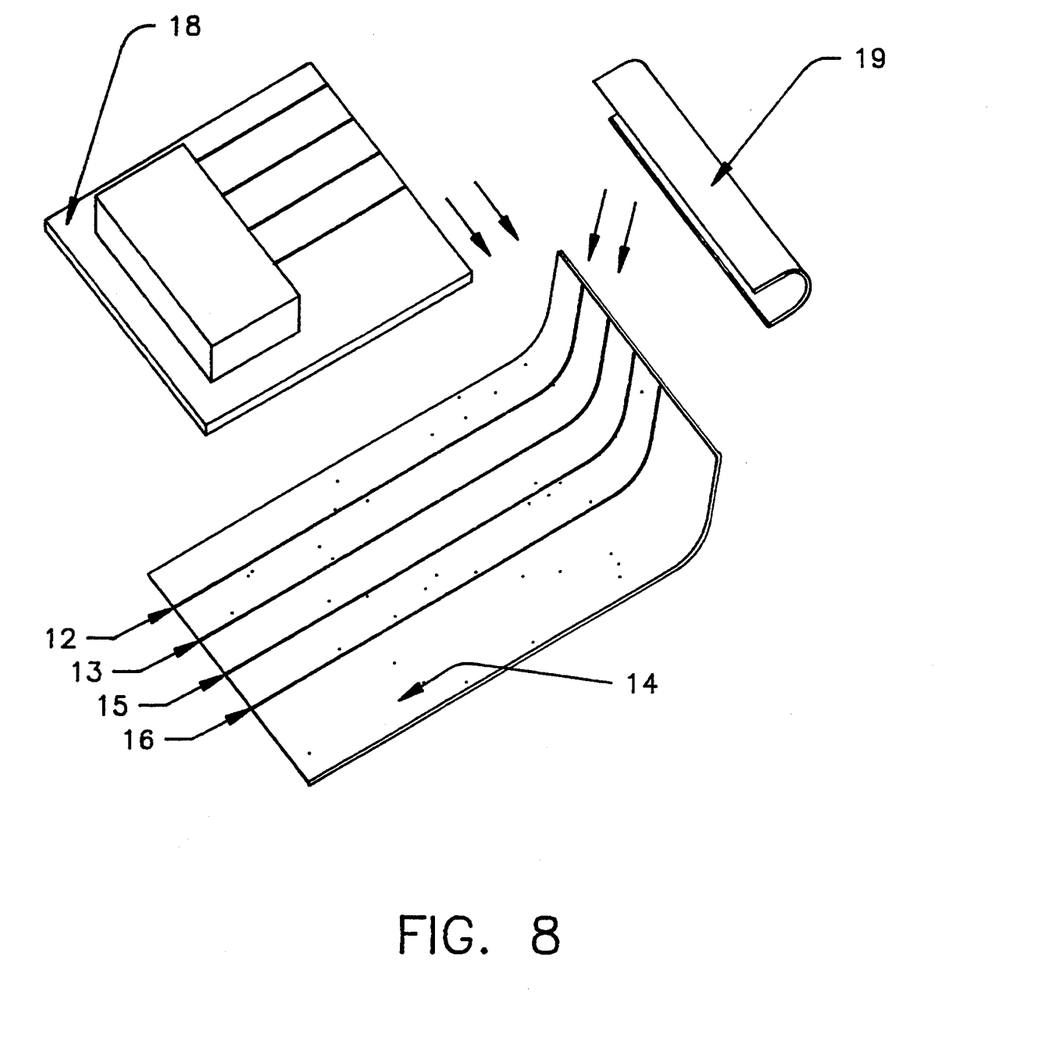
FIG. 8 shows how the soft circuit key pad is connected to an integrated circuit boards via circuit connection tabs.

7. Allow room for circuit continuation tabs 17 and circuit connection tabs 14. Baste the outside edges of the materials together. Circuit tabs are areas where, when all layers of fabric are stacked, the circuit layer protrudes out past the edges of the rest of fabric layers. Circuit continuation tabs 17 occur when the toy design has several parts, e.g., the arm and body of a doll. Circuit connection tabs 14 occur where an electric circuit board will be connected to the keypad via a plastic compression spring clip 19. The use of circuit connection tabs 14 allows more freedom of design because the circuit layer does not have to be in one continuous piece. After sewing, stuffing and attaching the doll's arm to the body, the circuit connection tabs 14 are sewn together allowing the circuit to continue from one section of the toy to the next.

8. Sew together the rest of the toy, treating the collated layers as a single piece of fabric.

Figure 9:
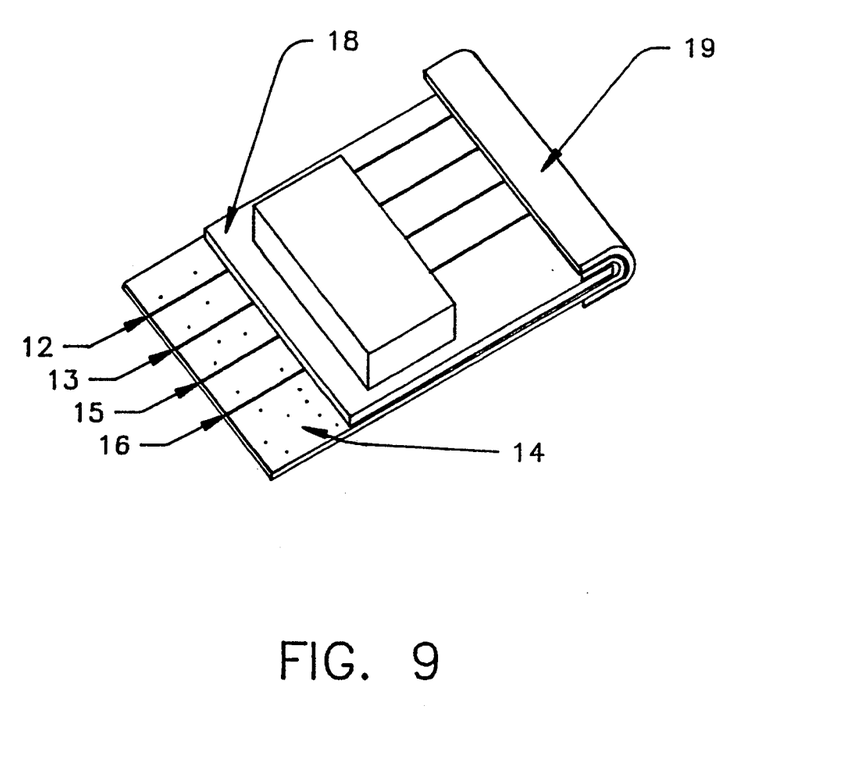
FIG. 9 shows the soft circuit key pad as connected to the integrated circuit board.

9. Finally, connect the electric circuit board 18 to the designated circuit connection tab 14 as illustrated in FIGS. 8 and 9. This is accomplished by lining up the conductive ink traces, folding the circuit connection tab 14 over the edge of the circuit board 18, and fastening at the end of the electric circuit board 18 with a plastic compression spring clip 19.

The basic switch may be repeated as many times as needed. When all of the layers of fabric and foam are compressed at the switch sites, holes in the foam allow the painted, conductive portions of the fabric in layers 7 and 9 to contact one another, closing the switch. When more than one switch site is used, there can be a common pathway connecting all switch sites, with distinct lead wires for each activity. All the pathways common and lead should be routed to a circuit connection tab 14, which can be connected to the electric circuit board 18 as described above.

Connection of the circuit board to the circuit tab may be done using standard garment snaps generally available at sewing notions stores. One side of the snap can be soldered to a connecting point on a printed circuit board, and the mating portion can be clamped to a designated spot on the fabric conductor strip.

Many types of circuits can be controlled by these "soft switches." For example, a sound generation circuit and small speaker may be embedded in a portion of a quilt having animal pictures printed over the switching layers. Closing the switches by applying pressure to the various areas of the quilt would cause the circuit to produce the appropriate animal sounds.

Trials have shown that conductive paint applied to woven fabrics or foam were much less conductive. The best fabrics, i.e., the ones upon which conductors applied in accordance with this invention retained a low resistance after several machine washes, were felt and pellon. As indicated above, the paint should soak into the fibers of the fabric. If the paint remains solely on the surface of the material, the paint is much less conductive before washing, and the resistance may increase after washing so much as to render the conductor unusable.

Two conductors made in accordance with this invention may be separated by a foam rubber spacer having apertures. A spacer having apertures prevents the two conductors from touching, but when pressure is applied, the conductors come into contact, thus acting as a switch. A low resistance is provided between the two conductors when the switch is closed by pressure.

Figure 1:
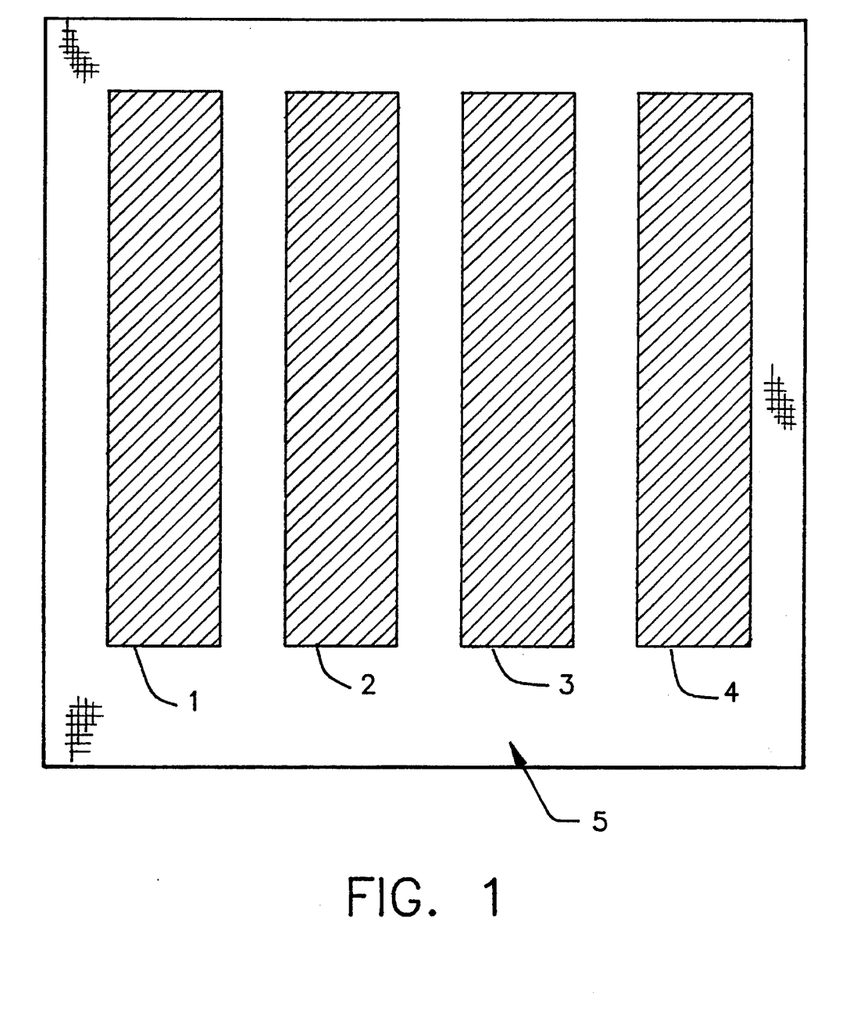
FIG. 1 shows the geometry of the conductive paint strips placed on fabric in order to test the conductivity of the strips.
Figure 2A:
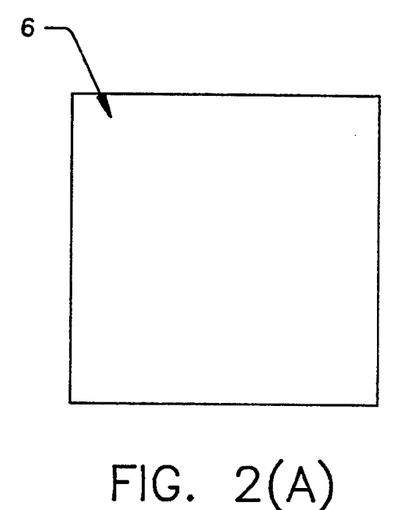
FIG. 2 shows the various layers which constitute the soft circuit key pad.
Figure 2B:
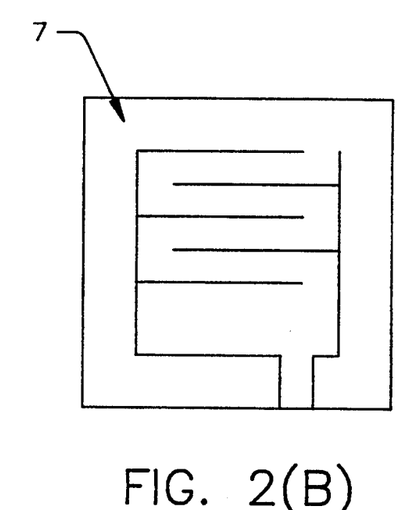
Figure 2C:
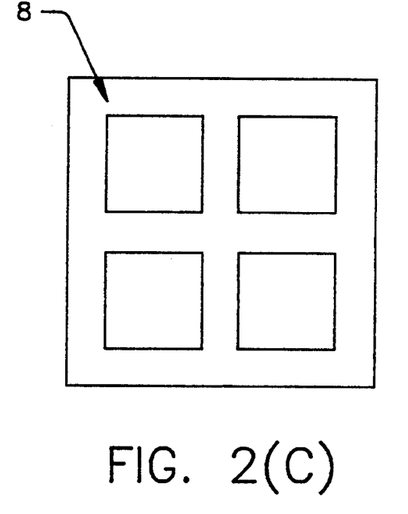
Figure 2D:
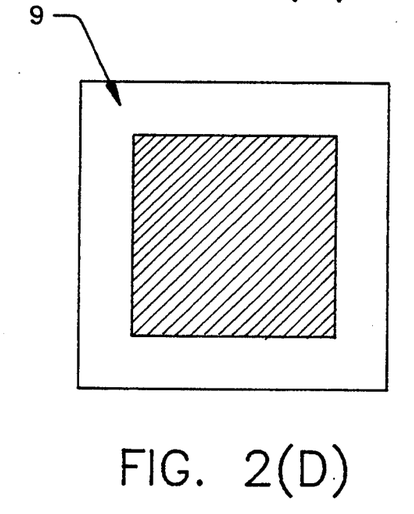

Referring now to FIG. 1, tests were performed with conductive ink painted onto material 5, which was either felt or cotton stock. The painted strips 1, 2, 3 and 4 were 12" long by ⅜" wide strips of W-0735 Condu-Cote Coating, in some instances with a special formulation containing twice the normal amount of carbon. The results of these trials are given below.

EXAMPLE I

A trial was performed using material as illustrated in FIG. 1 and as explained above. The standard W-0735 Condu-Cote Coating was used for strips 1 and 2, while a formulation with twice the normal amount of carbon was used for strips 3 and 4. The material 5 was felt. The paint was applied as indicated above; i.e., the material under the strip was saturated with paint. The paint was air dried at normal room temperature. The resistance was measured (a) after drying, but before curing; (b) after curing for 30 minutes at 155° C.; (c) after curing for 4 hours and 45 minutes at 155° C.; and (d) after a machine wash. The resistance values measured for each of strips 1–4 and at times (a)–(d) are given in Table I in kilohms.

TABLE I

|     | Standard Formulation | | Double-Carbon Formulation | |
| --- | --- | --- | --- | --- |
|     | Strip 1 | Strip 2 | Strip 3 | Strip 4 |
| (a) | 3.92 kΩ | 3.66 kΩ | 1.86 kΩ | 1.60 kΩ |
| (b) | 3.69 | 3.14 | 1.68 | 1.37 |
| (c) | 3.67 | 3.08 | 1.65 | 1.29 |
| (d) | 4.9 | 4.3 | 2.1 | 1.7 |

As can readily be seen from Table I, after curing, the resistance of the strip increases somewhat after machine washing the material, but still remains acceptably low for operation of the types of switches used in electronic toys.

EXAMPLE II

A trial was performed in which cotton was used for the material 5. Resistances of the strips were measured (a) after drying, but before curing; (b) after curing for 30 minutes at 170° C.; and (c) after a machine wash. The paint used for strips 1–4 was the same as for the corresponding strips in Example I. As shown in Table II, the resistance of the strips is substantially higher at each step than in Example I, and the percentage increase in resistance after washing is greater. This is believed to result from the difference in the density of the cotton material as compared to felt.

TABLE II

|     | Strip 1 | Strip 2 | Strip 3 | Strip 4 |
| --- | --- | --- | --- | --- |
| (a) | 10.1 kΩ | 7.25 kΩ | 6.6 kΩ | 5.5 kΩ |
| (b) | 10.49 | 6.94 | 6.92 | 6.90 |
| (c) | 20.00 | 11.0 | 19. | 17. |

EXAMPLE III

A trial was performed using a fusible middle weight pellon as material 5. Only two strips were painted on the material, strips 1 and 2. Strip 1 was made using the standard formulation of W-0735 Condu-Cote Coating; strip 2 was made using the double-carbon particle formulation. Resistances were measured (a) after drying, but before curing; (b) after curing for 30 minutes at 170° C.; and (c) after a machine wash. As can be readily observed, the resistance of either strip, although increasing with a machine wash, is still substantially below that of any of the strips painted on the cotton material of Example II after a machine wash.

TABLE III

|     | Strip 1 | Strip 2 |
| --- | --- | --- |
| (a) | 3.69 kΩ | 1.71 kΩ |
| (b) | 4.02 | 1.68 |
| (c) | 6.3 | 2.3 |

EXAMPLE IV

Example IV repeats the trials of Example III, except that material 5 was a heavyweight pellon. The initial resistances and the resistances after washing are all lower than resistances of the otherwise equivalent strips of Example II, which were painted on cotton material.

TABLE IV

|     | Strip 1 | Strip 2 |
| --- | --- | --- |
| (a) | 4.55 kΩ | 2.75 kΩ |
| (b) | 5.5 | 3.01 |
| (c) | 8.8 | 4.7 |

EXAMPLE V

Example V was performed with the same conditions as Example IV, except that cotton interfacing was used instead of pellon for material 5. Resistances were measured as in Example IV. The strips retain their low resistance values after the wash.

TABLE V

|     | Double-Carbon Formulation | |
| --- | --- | --- |
|     | Strip 1 | Strip 2 |
| (a) | 4.35 kΩ | 3.64 kΩ |
| (b) | 4.25 | 3.45 |
| (c) | 5.3 | 5.7 |

EXAMPLE VI

Example VI was performed with the same conditions as Example IV, except that "TRACE-A-PATTERN"

brand super thin synthetic fiber was used instead of pellon for material 5. Resistances were measured as in Example IV. Resistances increased above 10 kΩ after washing, and were considerably higher than that measured in Examples IV and V.

TABLE VI

|  | Double-Carbon Formulation | |
| --- | --- | --- |
|  | Strip 1 | Strip 2 |
| (a) | 8.4 kΩ | 7.2 kΩ |
| (b) | 7.43 | 6.95 |
| (c) | 12.33 | 13.1 |

EXAMPLE VII

Example VII was performed with the same conditions as Example IV, except that a lightweight pellon was used for material 5, and three strips were painted using the standard formulation of W-0735 Condu-Cote Coating; three strips were painted using the double-carbon formulation. Resistances were measured as in Example IV. Because pellon was used, all of the resistance measurements were low, and the resistance values after washing remained low.

TABLE VII

|  | Standard Formulation | | | Double-Carbon Formulation | | |
| --- | --- | --- | --- | --- | --- | --- |
|  | Strip 1 | Strip 2 | Strip 3 | Strip 4 | Strip 5 | Strip 6 |
| (a) | 3.4 kΩ | 3.55 kΩ | 2.29 kΩ | 1.68 kΩ | 1.69 kΩ | 1.90 kΩ |
| (b) | 3.82 | 3.73 | 2.31 | 1.68 | 1.67 | 1.96 |
| (c) | 5.6 | 5.6 | 3.4 | 2.5 | 2.5 | 2.8 |

EXAMPLE VIII

This trial was performed with only one painted strip of double-carbon W-0735 Condu-Cote Coating on felt material. A low-resistance strip was obtained, with the resistance remaining low when the material containing the strip was machine washed.

TABLE VIII

|  | Strip 1 |
| --- | --- |
| (a) | 2.73 kΩ |
| (b) | 2.3 |
| (c) | 3.3 |

EXAMPLE IX

This example was performed using felt as the base material with the standard formulation W-0735 Condu-Cote Coating as paint. Resistance of the strip was measured (a) after drying, but before curing; (b) after curing for 30 minutes at 170° C.; (c) after crumpling the fabric; and (d) after washing the crumpled fabric. As can be observed in Table IX, the test indicates that even if the strip is crumpled and washed, the strip retains a relatively low resistance value.

TABLE IX

|  | Strip 1 |
| --- | --- |
| (a) | 4.83 kΩ |
| (b) | 4.3 |
| (c) | 6.1 |
| (d) | 6.2 |

EXAMPLE X

In this example, the importance of curing the paint is shown. A felt fabric was used as the base material. One strip with standard formulation W-0735 Condu-Cote Coating was painted on the felt, and another strip with double-carbon content W-0735 Condu-Cote was used. The fabric with the strips was washed without curing the paint at elevated temperature. After washing, the resistances of the strips were measured. The standard formulation strip was measured at 30 megohms, while the strip with the double-carbon content paint was measured at 11 megohms. As clearly shown, the paint-saturated fabric must be cured at elevated temperatures to achieve a conductive strip that has a low conductivity after washing.

TABLE X

| Standard Formulation | Double-Carbon Formulation |
| --- | --- |
| 30 MΩ | 11 MΩ |

In each of Examples XI to XXII, the material was cured at 150° C. for 2 hours. The resistance of each strip was measured (in kΩ) after curing, and after the number of washes indicated.

EXAMPLE XI

In this example, three strips each of standard formulation and double-carbon W-0735 Condu-Cote Coating were used on felt. The coating was applied on both sides of the felt. The resistance values remained low, even after 9 washings, as indicated in Table XI.

TABLE XI

|  | Resistance in kΩ | | | | | |
| --- | --- | --- | --- | --- | --- | --- |
|  | Standard Formulation | | | Double-Carbon Formulation | | |
|  | Strip 1 | Strip 2 | Strip 3 | Strip 4 | Strip 5 | Strip 6 |
| after curing | 1.3 | 1.4 | 1.3 | 0.6 | 0.6 | 0.6 |
| 1st wash | 1.86 | 2.1 | 1.93 | 0.89 | 0.90 | 0.87 |
| 2nd wash | 1.88 | 2.20 | 2.0 | 0.93 | 0.92 | 0.91 |
| 3rd wash | 1.9 | 2.2 | 2.0 | 0.9 | 0.9 | 0.9 |
| 4th wash | 2.05 | 2.6 | 2.1 | 0.9 | 1.0 | 0.95 |
| 9th wash | 2.1 | 2.4 | 2.2 | 0.97 | 0.97 | 0.93 |

EXAMPLE XII

In this example, two strips each of standard formulation and double-carbon W-0735 Condu-Cote Coating were used on fusible medium pellon. The resistance values remained relatively low, even after 9 washings, as indicated in Table XII.

TABLE XII

|  | Resistance in kΩ | | | |
| --- | --- | --- | --- | --- |
|  | Standard Formulation | | Double-Carbon Formulation | |
|  | Strip 1 | Strip 2 | Strip 3 | Strip 4 |
| after curing | 4.9 | 6.2 | 2.7 | 2.0 |
| 1st wash | 6.2 | 8.1 | 3.5 | 2.7 |
| 2nd wash | 6.5 | 8.4 | 3.7 | 2.8 |
| 3rd wash | 6.7 | 8.4 | 3.7 | 2.78 |
| 4th wash | 6.8 | 8.7 | 3.8 | 2.8 |
| 9th wash | 7.99 | 10.2 | 4.25 | 3.18 |

EXAMPLE XIII

In this example, double-carbon W-0735 Condu-Cote Coating was used on two strips hand painted onto felt having long fibers running lengthwise with the strip.

The resistance values remained quite low after 4 washings, as indicated in Table XIII.

TABLE XIII

| | Resistance in kΩ | |
| | Double-Carbon Formulation | |
| | Strip 1 | Strip 2 |
|---|---|---|
| after curing | 0.86 | 0.74 |
| after 1st wash | 1.2 | 1.0 |
| after 2nd wash | 1.2 | 1.1 |
| after 3rd wash | 1.26 | 1.1 |
| after 4th wash | 1.3 | 1.1 |

EXAMPLE XIV

In this example, two strips each of standard formulation and double-carbon W-0735 Condu-Cote Coating were used. The material was hand painted on fusible medium pellon. Relatively low resistances were measured for both formulations even after as many as 9 washings, as seen in Table XIV.

TABLE XIV

| | Resistance in kΩ | | | |
| | Standard Formulation | | Double-Carbon Formulation | |
| | Strip 1 | Strip 2 | Strip 3 | Strip 4 |
|---|---|---|---|---|
| after curing | 5.2 | 6.3 | 2.5 | 2.5 |
| 1st wash | 7.5 | 8.8 | 3.6 | 3.0 |
| 2nd wash | 7.7 | 9.4 | 3.8 | 3.2 |
| 3rd wash | 7.7 | 9.3 | 3.7 | 3.2 |
| 4th wash | 8.1 | 9.5 | 3.8 | 3.2 |
| 9th wash | 9.3 | 10.7 | 4.5 | 3.7 |

EXAMPLE XV

In this example, two strips each of standard formulation and double-carbon W-0735 Condu-Cote Coating were used on fusible medium pellon. The two strips were hand painted on both sides, so that the material was saturated with the paint. As can be seen from Table XV, the resistance remained very low for both paint formulations, even after 9 washings.

TABLE XV

| | Resistance in kΩ | | | |
| | Standard Formulation | | Double-Carbon Formulation | |
| | Strip 1 | Strip 2 | Strip 3 | Strip 4 |
|---|---|---|---|---|
| after curing | 2.4 | 3.4 | 1.9 | 1.5 |
| 1st wash | 3.1 | 4.4 | 2.7 | 1.9 |
| 2nd wash | 3.3 | 4.8 | 2.7 | 2.1 |
| 3rd wash | 3.3 | 4.7 | 2.8 | 2.0 |
| 4th wash | 3.2 | 4.6 | 2.8 | 2.0 |
| 9th wash | 3.5 | 4.9 | 3.1 | 2.3 |

EXAMPLE XVI

In this example, a heavy weight pellon was used as the fabric material. Two strips each of standard formulation and double-carbon W-0735 Condu-Cote Coating were painted on one side of the fabric. As can be seen from Table XVI, the heavy weight pellon retains the low resistance even after 9 washings. However, the resistance is higher than with the medium pellon painted on both sides.

TABLE XVI

| | Resistance in kΩ | | | |
| | Standard Formulation | | Double-Carbon Formulation | |
| | Strip 1 | Strip 2 | Strip 3 | Strip 4 |
|---|---|---|---|---|
| after curing | 3.09 | 4.4 | 2.4 | 2.2 |
| 1st wash | 4.4 | 7.0 | 3.7 | 3.0 |
| 2nd wash | 4.6 | 7.3 | 3.96 | 3.4 |
| 3rd wash | 4.6 | 7.3 | 4.0 | 3.5 |
| 4th wash | 4.7 | 7.5 | 4.0 | 3.6 |
| 9th wash | 5.5 | 9.0 | 4.9 | 4.3 |

EXAMPLE XVII

In this example, two strips each of standard and double-carbon W-0735 Condu-Cote Coating were hand painted on lightweight pellon. As can be seen in Table XVII, the resistance of both strips remained low even after nine washings.

TABLE XVII

| | Resistance in kΩ | | | |
| | Standard Formulation | | Double-Carbon Formulation | |
| | Strip 1 | Strip 2 | Strip 3 | Strip 4 |
|---|---|---|---|---|
| after curing | 4.2 | 3.7 | 1.8 | 2.0 |
| 1st wash | 6.4 | 5.6 | 2.6 | 3.0 |
| 2nd wash | 6.6 | 5.7 | 2.7 | 3.0 |
| 3rd wash | 6.6 | 5.8 | 2.7 | 3.1 |
| 4th wash | 6.8 | 5.8 | 2.8 | 3.2 |
| 9th wash | 8.0 | 6.9 | 3.4 | 3.9 |

EXAMPLE XVIII

In this example, three strips of standard formulation W-0735 Condu-Cote Coating were air brushed on felt until the felt was saturated. As indicated in Table XVIII, multiple washings increased resistivity only slightly.

TABLE XVIII

| | Resistance in kΩ | | |
| | Standard Formulation | | |
| | Strip 1 | Strip 2 | Strip 3 |
|---|---|---|---|
| after curing | 13.2 | 8.6 | 10.3 |
| 1st wash | 20. | 12.2 | 15.4 |
| 2nd wash | 20.5 | 13.2 | 16.2 |
| 3rd wash | 22.2 | 13.2 | 16.7 |
| 4th wash | >20. | 13. | 17. |
| 9th wash | >20. | 15.9 | >20. |

EXAMPLE XIX

In this example, three strips each of standard formulation and double-carbon W-0735 Condu-Cote Coating were brush painted on felt. After the second wash, the material was crumpled. As can be seen in Table XIX, the resistance remained low after 9 washes, even with the additional crumpling after the second wash.

TABLE XIX

| | Resistance in kΩ | | | | | |
| | Standard Formulation | | | Double-Carbon Formulation | | |
| | Strip 1 | Strip 2 | Strip 3 | Strip 4 | Strip 5 | Strip 6 |
|---|---|---|---|---|---|---|
| after curing | 2.3 | 2.3 | 1.5 | 0.9 | 0.8 | 0.8 |
| 1st wash | 3.2 | 3.3 | 2.0 | 1.4 | 1.2 | 1.2 |
| 2nd wash | 3.4 | 3.4 | 2.1 | 1.4 | 1.2 | 1.2 |
| After crumpling | 3.6 | 3.6 | 2.2 | 1.5 | 1.3 | 1.3 |
| 3rd | 3.4 | 3.5 | 2.2 | 1.5 | 1.2 | 1.3 |

TABLE XIX-continued

| | Resistance in kΩ | | | | | |
|---|---|---|---|---|---|---|
| | Standard Formulation | | | Double-Carbon Formulation | | |
| | Strip 1 | Strip 2 | Strip 3 | Strip 4 | Strip 5 | Strip 6 |
| wash 4th wash | 3.5 | 3.6 | 2.3 | 1.5 | 1.25 | 1.3 |
| 9th wash | 4.1 | 4.1 | 2.4 | 1.6 | 1.3 | 1.3 |

EXAMPLE XX

In this example, three strips each of standard formulation and double-carbon W-0735 Condu-Cote Coating were used on cotton broadcloth. The strips were painted by brush. As can be seen from Table XX, the resistance values were initially high and increased substantially upon washing, indicating that cotton broadcloth is not a suitable base material.

TABLE XX

| | Resistance in kΩ | | | | | |
|---|---|---|---|---|---|---|
| | Standard Formulation | | | Double-Carbon Formulation | | |
| | Strip 1 | Strip 2 | Strip 3 | Strip 4 | Strip 5 | Strip 6 |
| after curing | 10.6 | 10.1 | 10.9 | 7.1 | 6.9 | 6.8 |
| 1st wash | 22.4 | 23. | 26. | 19.5 | 20. | 21. |
| 2nd wash | 27. | 27. | 31. | 29. | 33. | 33. |
| 3rd wash | 30.1 | 32. | 37. | 42. | 47. | 48. |
| 4th wash | 36. | 38. | 45. | 62. | 70. | 68. |

EXAMPLE XXI

In this example, three strips of standard formulation W-0735 Condu-Cote Coating were air brushed on cotton broadcloth. The resistance values were high because this method of painting does not sufficiently penetrate the fabric, and because cotton broadcloth is not a suitable material for use in this invention. The results are presented in Table XXI.

TABLE XXI

| | Resistance in kΩ | | |
|---|---|---|---|
| | Standard Formulation | | |
| | Strip 1 | Strip 2 | Strip 3 |
| after curing | 61.5 | 61.0 | 59.9 |
| 1st wash | 120. | 210. | 220. |
| 2nd wash | <not measured> | 1900. | 1900. |

EXAMPLE XXII

In this example, one strip each of standard formulation and double-carbon W-0735 Condu-Cote Coating was painted on felt, across the grain of the felt. Resistance valves presented in Table XXII indicate that felt is a satisfactory base material for conductors and is able to withstand repeated washings.

TABLE XXII

| | Resistance in kΩ | |
|---|---|---|
| | Standard Formulation Strip 1 | Double-Carbon Formulation Strip 2 |
| before curing | 2.2 | 1.3 |
| after curing | 1.99 | 1.19 |
| after 1st wash | 2.5 | 1.6 |

TABLE XXII-continued

| | Resistance in kΩ | |
|---|---|---|
| | Standard Formulation Strip 1 | Double-Carbon Formulation Strip 2 |
| after 2nd wash | 2.6 | 1.57 |
| after 7th wash | 2.9 | 1.75 |

EXAMPLE XXIII

In this example, two strips of standard formulation W-0735 Condu-Cote Coating were hand painted on ⅛ inch foam rubber. As can be seen from Table XXIII, the resistance increased substantially after the first and second washes, thus indicating that foam rubber is not a satisfactory base material for this invention.

TABLE XXIII

| | Resistance in kΩ | |
|---|---|---|
| | Standard Formulation | |
| | Strip 1 | Strip 2 |
| after curing | 1.24 | 1.45 |
| after 1st crumpling | 2.0 | 2.6 |
| after 2nd crumpling | 2.91 | 3.29 |
| after 1st wash | 6.8 | 8.2 |
| after 2nd wash | 16.8 | 19.3 |

EXAMPLE XXIV

In this example, two strips of standard formulation W-0735 Condu-Cote Coating were hand painted on felt and allowed to dry overnight. As can be seen from Table XXIV, the resistances of the painted strips on this material remain low, even after 7 washings.

TABLE XXIV

| | Resistance in kΩ | |
|---|---|---|
| | Standard Formulation | |
| | Strip 1 | Strip 2 |
| before curing | 1.0 | 1.3 |
| after curing | 0.96 | 1.2 |
| after 1st wash | 1.15 | 1.45 |
| after 2nd wash | 1.15 | 1.4 |
| after 7th wash | 1.2 | 1.5 |

EXAMPLE XXV

In this example, two strips of standard formulation W-0735 Condu-Cote Coating were hand painted on felt. The felt was heated to cure the paint before it had air-dried. These results, listed in Table XXV, indicate that air-drying is not necessary before curing.

TABLE XXV

| | Resistance in kΩ | |
|---|---|---|
| | Standard Formulation | |
| | Strip 1 | Strip 2 |
| after curing | 0.76 | 0.85 |
| after 1st wash | 0.95 | 1.05 |
| after 2nd wash | 1.0 | 1.2 |

EXAMPLE XXVI

In this example, two strips of standard formulation W-0735 Condu-Cote Coating were air brushed on felt, with an excess of paint applied. As can be seen from the results in Table XXVI, the application of large amounts of paint resulted in conductive strips that retained their low resistances even after 7 washings.

TABLE XXVI

|  | Resistance in kΩ | |
|---|---|---|
|  | Standard Formulation | |
|  | Strip 1 | Strip 2 |
| before curing | 0.56 | 0.67 |
| after curing | 0.55 | 0.65 |
| after 1st wash | 0.7 | 0.8 |
| after 2nd wash | 0.73 | 0.8 |
| after 7th wash | 0.8 | 0.9 |

In view of the foregoing, it is readily seen that a wash-resistant, non-toxic, safe, fabric-based electrical conductor and a method of making the same has been disclosed. While especially suitable for electrical systems in soft toys, and particularly for use as the conductors in a switching element in such toys, other uses will be readily apparent to those skilled in the art.

What is claimed is:

1. An electrical conductor comprising a nonwoven fabric base saturated with a heat-cured conductive mixture, the conductive mixture comprising a mixture of a latex vehicle with carbon particles.

2. The electrical conductor of claim 1 wherein the nonwoven fabric base is selected from a group consisting of felt and pellon.

3. The electrical conductor of claim 1 wherein the conductive mixture comprises carbon in a one to ten percent loading range in a water-based latex with a plurality of organic, ionic or non-ionic surfactants but without volatile organics.

4. The electrical conductor of claim 1 wherein the electrical conductor is wash-resistant.

5. The electrical conductor of claim 1 wherein the electrical conductor is non-toxic.

6. The electrical conductor of claim 1 wherein the electrical conductor is crumple-resistant.

7. The electrical conductor of claim 1 wherein the electrical conductor is combined with a plurality of other electrical conductors as defined in claim 1 to form an electric component capable of directing or controlling an electric current flow.

* * * * *